US011146065B2

(12) United States Patent
Anderson (10) Patent No.: US 11,146,065 B2
(45) Date of Patent: Oct. 12, 2021

(54) ENERGY MANAGEMENT CAPSULE

(71) Applicant: INTELLIGENT LILLI LIMITED, Woking (GB)

(72) Inventor: Leonard Anderson, Surrey (GB)

(73) Assignee: INTELLIGENT LILLI LIMITED, Woking (GB)

( * ) Notice: Subject to any disclaimer, the term of this patent is extended or adjusted under 35 U.S.C. 154(b) by 626 days.

(21) Appl. No.: 15/515,535

(22) PCT Filed: Sep. 30, 2015

(86) PCT No.: PCT/GB2015/000275
§ 371 (c)(1),
(2) Date: Mar. 29, 2017

(87) PCT Pub. No.: WO2016/051125
PCT Pub. Date: Apr. 7, 2016

(65) Prior Publication Data
US 2017/0237257 A1    Aug. 17, 2017

(30) Foreign Application Priority Data

Sep. 30, 2014 (GB) ...................... 1417259

(51) Int. Cl.
*H02J 3/14* (2006.01)
*H02J 13/00* (2006.01)
(Continued)

(52) U.S. Cl.
CPC ............... *H02J 3/14* (2013.01); *G01R 22/06* (2013.01); *H02J 13/0062* (2013.01);
(Continued)

(58) Field of Classification Search
CPC .. G01R 22/06; H02J 13/0062; H02J 13/0079; H02J 3/14; H02J 2003/143;
(Continued)

(56) References Cited

U.S. PATENT DOCUMENTS 7,720,576 B2 * 5/2010 Warren ...................... H02J 9/06
700/286
2007/0220907 A1 9/2007 Ehlers
(Continued)

FOREIGN PATENT DOCUMENTS

| CA | 2753809 A1 | 3/2013 |
|---|---|---|
| GB | 2516514 A | 1/2015 |

(Continued)

OTHER PUBLICATIONS

EPO Exam Report dated Mar. 2, 2020.
(Continued)

*Primary Examiner* — Toan T Vu
(74) *Attorney, Agent, or Firm* — AEON Law, PLLC; Adam L. K. Philipp; Shan Liao (57) ABSTRACT

An energy management capsule is disclosed, being a mains-powered device with multiple sensors or electrical output controllers connected to the Internet. Web services analyse sensor data for controlling electrical outputs and providing information about significant changes to predicted sensor values. Several Energy Management Capsules may be interconnected via mains powerlines, wireless communications or wired digital networks. It reports failure of mains power supply.

7 Claims, 6 Drawing Sheets

(51) Int. Cl.
  *H04B 3/54* (2006.01)
  *G01R 22/06* (2006.01)
  *H04L 29/08* (2006.01)

(52) U.S. Cl.
  CPC .......... *H02J 13/0079* (2013.01); *H04B 3/542* (2013.01); *H02J 2310/14* (2020.01); *H02J 2310/64* (2020.01); *H04L 67/12* (2013.01); *Y02B 90/20* (2013.01); *Y04S 40/121* (2013.01); *Y04S 40/124* (2013.01); *Y04S 40/128* (2013.01)

(58) Field of Classification Search
  CPC .... H02J 2003/146; H04B 3/542; H04L 67/12; Y02B 90/2638; Y02B 90/2669; Y02B 90/2692; Y04S 40/124; Y04S 40/128; Y04S 40/146
  USPC .................. 307/31; 700/20, 62, 295, 297
  See application file for complete search history.

(56) References Cited

U.S. PATENT DOCUMENTS

| | | | | |
|---|---|---|---|---|
| 2008/0172312 | A1* | 7/2008 | Synesiou | G06Q 20/102 705/34 |
| 2010/0114389 | A1* | 5/2010 | Chatterton | G06F 1/3203 700/291 |
| 2010/0217550 | A1* | 8/2010 | Crabtree | H02J 13/0079 702/62 |
| 2011/0090040 | A1 | 4/2011 | Allen et al. | |
| 2011/0238235 | A1 | 9/2011 | Xia et al. | |
| 2011/0266869 | A1 | 11/2011 | Katru et al. | |
| 2012/0060044 | A1 | 3/2012 | Jonsson et al. | |
| 2012/0166143 | A1 | 6/2012 | Brown | |
| 2012/0179177 | A1 | 7/2012 | Nishiyama et al. | |
| 2012/0221955 | A1* | 8/2012 | Raleigh | H04L 12/1485 715/736 |
| 2013/0274942 | A1* | 10/2013 | Rees | G06F 1/3206 700/295 |
| 2014/0018969 | A1 | 1/2014 | Forbes, Jr. | |
| 2015/0255932 | A1* | 9/2015 | Dicks | H01R 13/6683 307/326 |

FOREIGN PATENT DOCUMENTS

| | | |
|---|---|---|
| JP | 2013115885 A | 6/2013 |
| WO | 2006059195 A1 | 6/2006 |
| WO | 2013160705 A2 | 10/2013 |
| WO | 2014141191 A2 | 9/2014 |

OTHER PUBLICATIONS

JPO Exam Report dated Aug. 20, 2019.
The Second Office Action issued by CNIPO dated Mar. 4, 2020.
UKIPO Exam Report dated Feb. 28, 2020.
UKIPO Exam Report dated Nov. 9, 2020.

* cited by examiner

ENERGY MANAGEMENT CAPSULE

FIELD OF THE INVENTION

This invention relates to an energy management capsule.

BACKGROUND OF THE INVENTION

Current security and environmental control system have a single function, such as intruder alarms or central heating thermostats. Existing hardware and software are not multi-functional, and are unable to act as both an alarm and a thermostatic control system. The electrical power industry also needs method of balancing demand with fluctuating levels of supply. This can be done by using tariffs that control the use of power to equipment that is not time dependent, such as refrigeration or storage heating. Single function controllers require dedicated electrical circuits and metering.

SUMMARY OF THE INVENTION

An aspect of the invention provides an energy management module or capsule comprising connecting means for connection to a mains power supply, means for physical connection to one or more external electrical devices, data transmission and receiving means for communicating data with the Internet and control means for controlling the electrical output to the one or more external electrical devices using data received from the Internet using the data transmission and receiving means.

The module may further comprise an input mains power measurement sensor, or other sensors, and an electrical output controller.

The module may further comprise a digital communications capability and controlled by web services via the Internet.

The module may be configured to be connected with wires or wirelessly to other external energy management modules or capsules containing sensors or other input devices.

The module may be configured to communicate digitally via mains wiring or low voltage wiring with one or more other modules, which may have a different configuration of sensors or electrical outputs or digital communications components.

The module may be configured to transmit sensor data to web services and receives data to control the electrical output of one or more module or capsule.

The module may be configured to continue to communicate via the Internet after loss of mains power to any interconnected module or capsule.

There is also provided method of processing of sensor data collected using a module network according to any preceding definition, or other collected time series data, that in use identifies changes of patterns of sensor data or forecast future demand for electrical power.

The method may further comprise publishing results according to software applications connected to the Internet or other telecommunications networks.

BRIEF DESCRIPTION OF THE DRAWINGS

The invention will now be described, by way of example only, with reference to the accompany drawings, in which.

DETAILED DESCRIPTION OF PREFERRED EMBODIMENTS

Embodiments herein use the concept of "the Internet of Things". In an energy management module, or 'capsule', sensors inside, or connected to the capsule measure physical properties which are sent as data to software systems via the Internet. The software processes the data and sends control signals back to the capsule or multiple capsules. Other users or systems can also receive information.

Features include the following.

Capsules are powered by a mains voltage input power source that is measured by a sensor.

Power output can be controlled remotely or by internal firmware or with manual switches.

Capsules have additional sensors for data analysis used to control mains or low voltage electrical output from a capsule.

Software stores sensor data, combines it with other data sources, performs data analytics or provides information for other purposes, such as predicting future electrical demand.

Capsules have stored energy to enable transmission to the Internet after loss of mains power.

Multiple Capsules can be interconnected in communications networks.

System settings can be controlled by Web services or smartphones.

This document uses the inclusive "or", which can mean "and".

Consequently, the invention is ubiquitous. It can be used for security monitoring, alarms, air conditioning, refrigeration, power storage, heating or wherever there are benefits from remote control of power consuming or storage devices.

Capsules can be built into mains powered electrical equipment or enclosures, such as refrigerators or mains power sockets.

Capsule electrical output, both mains or low voltage, can be controlled remotely by Web services.

Data can be transmitted continuously after a mains power failure.

Data can be combined with data from other sources.

Multiple telecommunications methods can be deployed.

Data is protected by strong authentication and encrypted data storage.

Firmware can be updated remotely.

Data collected can be used by other software application developers with the consent of the data owners.

Figure 1:
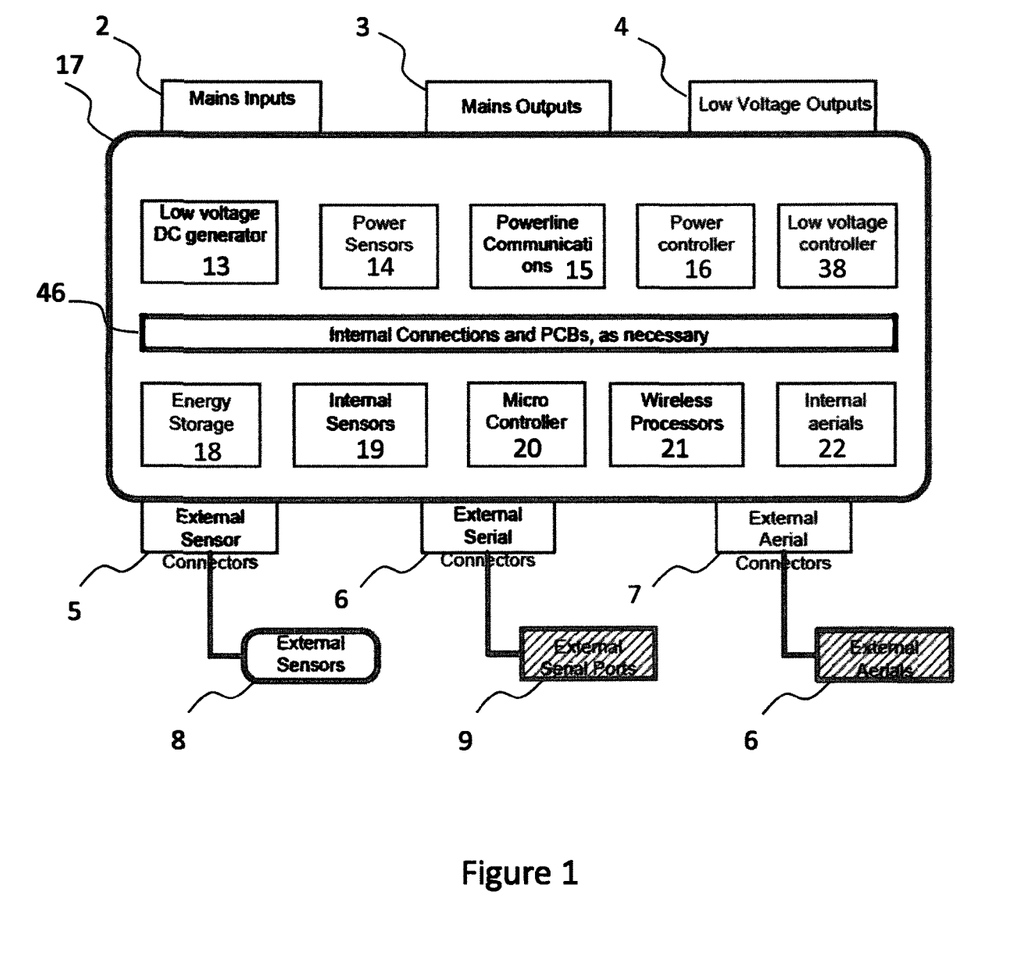
FIG. 1 is a schematic diagram showing in overview the concept of an energy management capsule.
Figure 2:
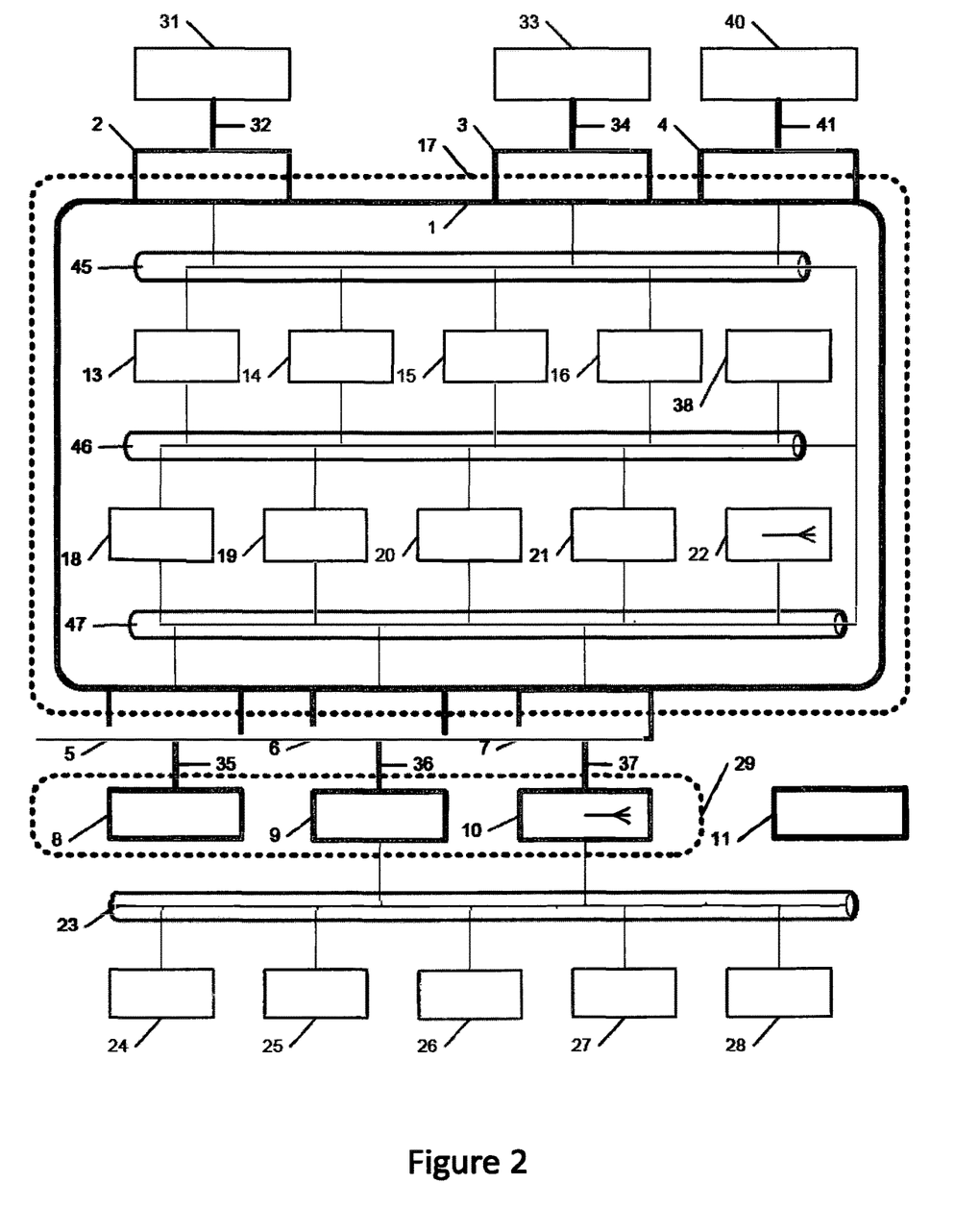
FIG. 2 is a block diagram which shows the relationship between hardware and software modules of the FIG. 1 capsule.

Referring to FIGS. 1 and 2, there is shown an energy management capsule 17 as an enclosure for multiple sensors and electronics that control multiple electrical outputs. Sensors and can be internal or external to the capsule 17. Communication with sensors and telecommunications can be wired or wireless. Connection to the Internet is by wired or wireless telecommunications. The capsule 17 is electrically insulated from the surrounding physical embodiment, except where needed for electrical connection. Aerials 6 or 22 are mounted externally or internally to meet the requirements of different embodiments.

Referring specifically to FIG. 2, both hardware and software modules are shown.

A printed circuit board (PCB) assembly 1 of the capsule 17 has connectors 2, 3, 4, 5, 6, 7 for making electrical connections with components that are external to the PCB assembly 1 and capsule 17. Connector 2 is a mains input connector, connected to a mains AC voltage supply 31 via wires 32. Connector 5 is an external sensor that connects to an optional number of external sensors 8 via wires 35. Connector 6 connects to a variable number of serial ports 9 via wires 36. Connector 4 is a lower voltage output connector connected to low voltage electrical outputs 40 via wires 41.

The capsule 17 insulates or supports electrical components. It may be constructed from several parts. The capsule 17 may enclose contain or connect to other capsules 17 or capsules 29 in any embodiment.

The PCB assembly 1 may be constructed from several parts. Electrical circuits 45, 46 and 47 represent connections between PCB assembly 1 components. Input signals or firmware can activate parts of the PCB assembly 1 during manufacture or operation.

Circuit 45 is connected to the connectors 2, 3 and 4 and modules 13, 14, 15 and 16, which operate at mains voltage or are in close proximity to high voltage.

Module 13 produces low voltage DC current for used energy storage in module 18 and by other modules requiring low voltage DC. Module 14 measures the current used in the electrical outputs 33. Module 15 is the input and output processor for powerline communications via connector 2 and wires 32 through the supply 31 to external energy management capsules. Module 16 is a power controller that controls the mains voltage outputs 33. Module 38 controls the low voltage outputs 40.

The circuits 46 connect all internal modules and circuits in PCB assembly 1. Modules 13, 14, 15, 16 and 38 are described above.

Module 18 is for low voltage energy storage generated by Module 13. It continues to provide power for low voltage modules if the mains voltage supply 31 is not available. Module 19 is or are the sensor(s) connected to the PCB assembly 1 or capsule 17. Module 20 is the programmable microcontroller for all the modules referenced in FIG. 2. It contains firmware that is uploaded via serial connection block 6 or external antennae block 7 or internal antennae module 22. Module 21 is a wireless communications processing module for receiving and transmitting data or control signals. Module 21 can be programmed for multiple protocols dependent on the needs of a specific embodiment and linked energy management capsules. Module 22 is the variable number of internal antennae that is or are mounted on PCB assembly 1 or capsule 17.

Circuits 47 control communications with the connector 5, serial communications with the connector 6 and radio frequency communications with the internal antennae module 22 or Antennae 10.

The capsule 29 encloses any or all of sensors 8, serial ports 9 and external antennae 10. More than one capsule 29 may be connected to the capsule 17. Sensors 11 are wirelessly connected to the PCB assembly 1 via internal antennae module 22 or external antennae 10.

Pipe 23 represents the network of digital communications with the Internet or Local Area Networks via wired and wireless connections. Pipe 23 provides Web Services 24, 25, 26, 27 and 28. In this case, service 24 is a data storage service. Service 25 is an identity provision and personal data store. Service 26 is a data analysis service which includes time-series comparison of historic sensor values with recent values. These are termed as changes. The service 27 is the presentation of sensor values and changes to Internet connected devices, such as web browsers or smartphone apps. Service 28 is the means of controlling services. It remotely controls electrical output from modules 16 or 38 or modifies firmware in the modules 20 or 21.

Figure 3:
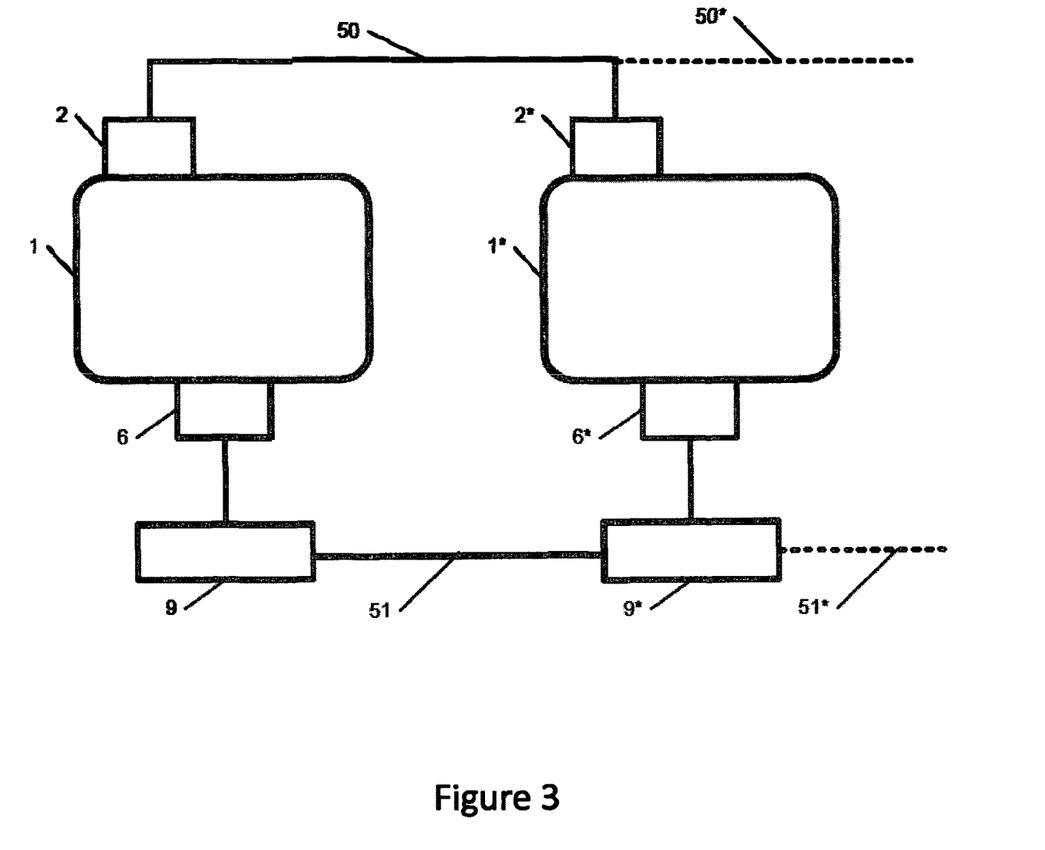
FIG. 3 is a block diagram showing the interconnection of plural capsules.

FIG. 3 shows a network of two or more energy management capsules. For clarity, the capsules or enclosures are not shown.

PCB assembly 1 connects via the mains connector 2 and the wires 50 to PCB assembly 1\* via the connector 2\*. Wires 50 conduct digital signals through the mains power circuits. Wires 50\* extend digital signals to more PCB Assemblies 1\*. PCB Assembly 1 connects via connector 6, ports 9 and Wires 51 to PCB Assembly 1\*, via Ports 9\* and Connector 6\*. Wires 51 conduct digital signals through low voltage circuits. Wires 51\* extends digital signals to more PCB Assemblies 1\*.

In a network of Capsules, at least one has continuous connection to the Internet when the mains power supply is not available. It informs a Web service that power has been lost.

Figure 4:
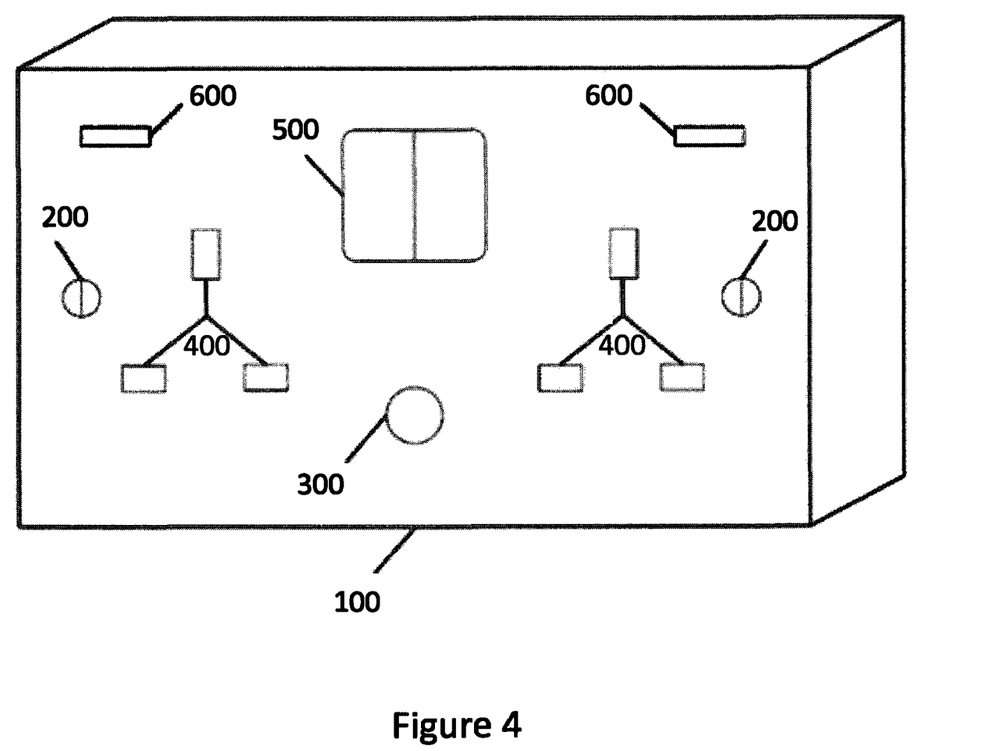
FIG. 4 is a perspective diagram showing the capsule in a practical embodiment as a multi-sensor power socket enclosure.

FIG. 4 shows a smart power socket as an embodiment of the invention. Module 100 is an enclosure that contains an internal capsule as described in FIG. 2. The enclosure 100 has fixings 200 that secure it to a pattress with a mains power supply. Sensor 300 is a motion sensor embedded in the fascia of the enclosure 100.

Power is supplied at UK Standard 13 Amp mains sockets 400. Current is measured by internal power sensors and controlled by actuators. Switches 500 can be used to isolate power from the sockets 400. Indicators 600 show whether power is being supplied to Sockets 400.

This embodiment can be used as the hardware for a wellbeing monitor for older people living alone. The software analyses data hourly for changes from normal behaviour and shows results on a Web browser or smartphone application.

Several such Smart Power Sockets can be networked in new buildings as alternatives to standard power sockets, or as replacement power sockets in existing properties.

Figure 5:
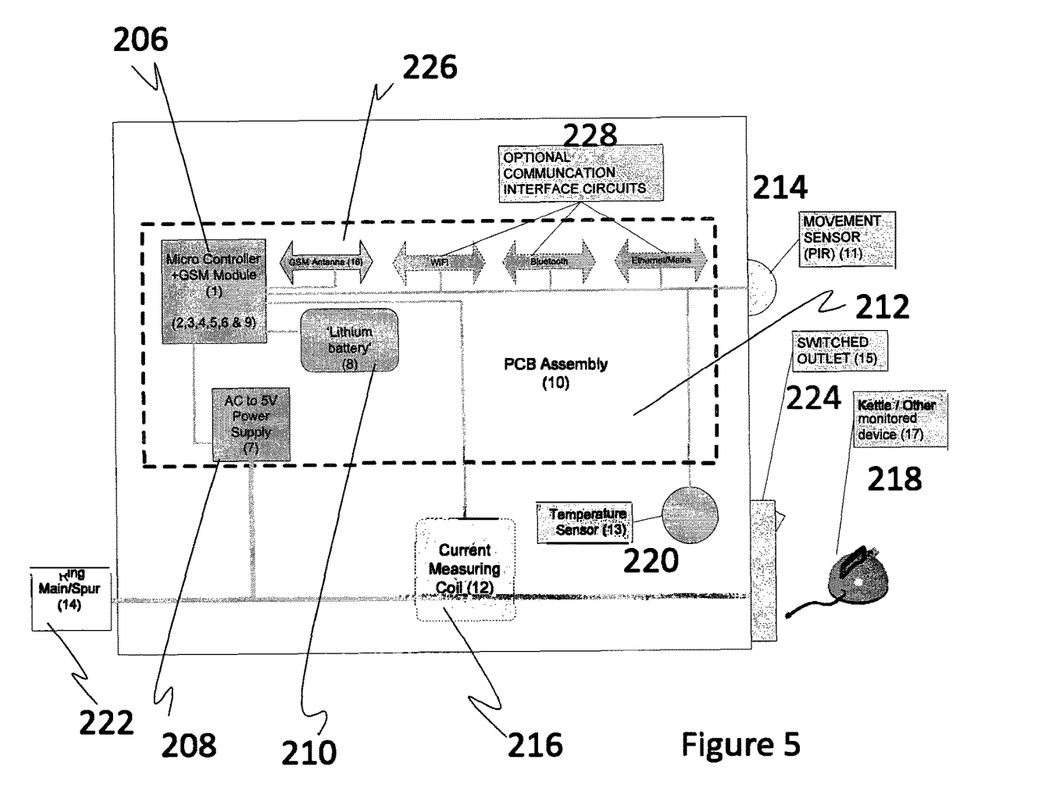
FIG. 5 is a schematic diagram showing in overview a second embodiment application.

A similar system is shown in FIG. 5. Here, as with the FIG. 4 system, the socket is typically installed by a professional installer, and would replace an existing outlet. In order to ensure efficient GSM transmission of data the socket may be fitted proud to the wall and must not be fitted within a metal pattress box. The permanent installation thus provides a non-removable sensor system within the home. (A plug in device is subject to removal by the user). Additionally a fixed location ensures reliable GSM transmission. Installation must include an assessment of GSM network coverage.

Within the outlet, a custom electronics assembly provides the functionality to support power monitoring, control, other sensor measurement and communication to the Internet. The unit may support communication to additional Smart Power Sockets or remote sensors located within the property. Bluetooth Low Energy, Wi-Fi, Ethernet or other communication systems, such as Sig Fox, may also be accommodated.

The system encloses a low voltage DC storage system for two functions.
(a) operation of the microcontroller system for a limited time such that communication is maintained during a mains power outage. Loss of mains power is communicated to external monitoring software.
(b) providing peak currents sufficient to operate the telecommunications module, allowing a smaller AC to DC converter to be incorporated.

The unit has been designed to meet all requisite safety and EMC standards in order to gain CE certification.

Sockets are developed in several versions with different internal functions and options.

The system may comprise all or a selection of the following sub-components:
- a low power microcontroller system 206. The implemented micro controller sub-system uses proprietary programs which can be supported by Over The Air programming (OTA). Firmware program changes can be implemented, after installation, by remote wireless access;
- an AC to DC convertor 208 to power the microcontroller and associated electronics;
- a lithium battery 210;
- a PCB assembly 212 containing the electronics;
- a motion detector 214 using, for example, a passive infra red sensor connected via an analogue interface;
- a current sense coil 216 which, in use, measures the current consumption of the appliance under observation (which could be, for example, a kettle 218 connected via a mains power cord);
- a temperature sensor 220;
- a ring main 222 (incoming voltage) to the socket;
- one or more switched 13A outlets 224; and
- an internal GSM antenna 226.

The system may also include communication interface circuits 228, such as WIFI, Bluetooth or Ethernet/mains circuits.

The microcontroller system 206 includes, without limitation,
- non-volatile program memory, containing the Operating System and Program Firmware. The memory also provides means for storage of locally collected data even in the event of power or network failure. The data can subsequently be accessed when systems are restored;
- sufficient RAM for program execution and computation;
- a GSM communication module;
- digital inputs and outlets;
- analogue inputs and outlets; and
- Integrated charging system for the battery.

The socket is built using PCB assemblies fitted into an enclosure made from a power socket face-plate and a modified commercially available pattress box. Components are embedded in PCBs, connected with soldered wires or clips. Separation of low voltage and high voltage is with shaped insulating plastic mouldings.

The electronics components may be miniaturised into a capsule that will fit into a wide range of international pattress and fascia designs. Connections with external components are made via connector blocks.

The physical design ensures that the electronics can fit within existing power socket outlets or as part of a new socket assembly. Such a design will enable the retrofit to existing wall power outlets. The back-up battery may be replaced without access to the components inside the power socket capsule.

The power socket capsule contains the microcontroller and electronics, which is present in all use cases. For power sockets that are not located in the optimum location for sensors, an external power capsule containing external sensors may be connected with wires or wirelessly.

Figure 6:
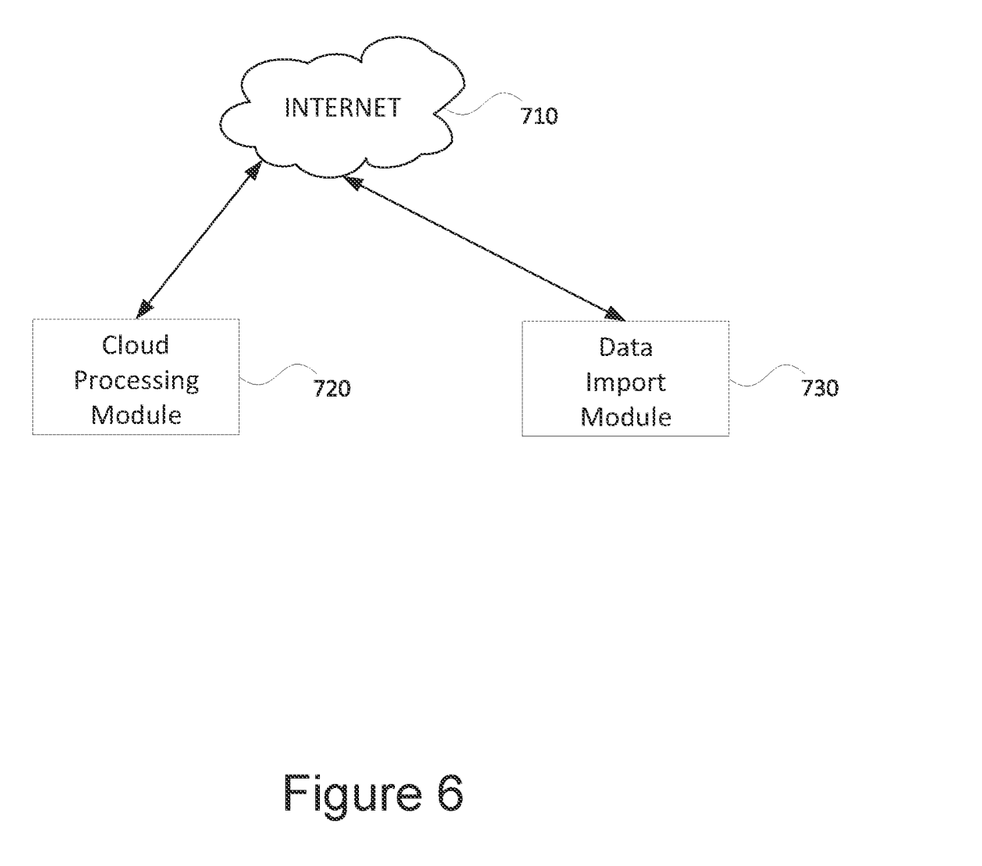
FIG. 6 is a schematic diagram showing an embodiment of an energy management capsule, according to one or more improved technologies.

FIG. 6 depicts an embodiment of an energy management capsule, according to one or more improved technologies. Cloud processing module 720 and data import module 730 connect to Internet 710 respectively. Cloud processing module 720 and data import module 730 are configured to communicate to the energy management module via Internet 710.

It will be appreciated that the foregoing are merely an examples of embodiments and some examples of their use. The skilled reader will readily understand that modifications can be made thereto without departing from the true scope of the inventions.

The invention claimed is:

1. An energy management module or capsule comprising connecting means for connection to a mains power supply,
means for physical connection to one or more external electrical devices,
wired or wireless data transmission and receiving means for communicating data with the Internet and electrical output controllers for controlling mains or low voltage electrical output to the one or more external electrical devices using data received from the Internet using the data transmission and receiving means,
wherein the module or capsule is configured to communicate digitally via mains wiring or low voltage wiring, with one or more other external energy management modules or capsules, which containing one or more sensors, have one or more configuration of sensors, or other input devices, or other electrical outputs, or other digital communications components;
further comprising web services processing means, arranged to collect sensor data from a module or capsule network, and other collected time series data, that in use identifies changes of patterns of sensor data and forecast future demand for electrical power;
further comprising low voltage internal energy storage means to enable data transmission to the Internet after loss of mains power, and informs a Web service that power has been lost and in a network of modules or capsules, at least one of them has continuous connection to the Internet when the mains power supply is not available;
means to combine the sensor data and the other collected time series data to analyse and predict forecast future demand for electrical power;
wherein the web services processing means are used to analyse multiple data sources to predict future electrical demand and control mains or low voltages electrical outputs from the modules or capsules; and
whereby data collected can be used by other software application developers with the consent of the data owners;
wherein the module or capsule is configured to transmit sensor data to web services and receives data to control the electrical output of one or more module or capsule; and
wherein the module or capsule is built into mains powered electrical equipment or enclosures.

2. The energy management module or capsule according to claim 1, wherein the equipment that is not time dependent comprises refrigeration or storage heating equipment.

3. The energy management module or capsule according to claim 1 further comprising at least one or a combination of sensors which are arranged to measure: input mains power measurement, temperature or motion;
  whereby the invention can be used for security monitoring, alarms, air conditioning, refrigeration, power storage or heating; and
  is arranged to be installable inside mains powered electrical equipment or enclosures.

4. The energy management module or capsule according to claim 1, wherein the electrical output is controllable remotely or by internal firmware or with manual switches.

5. The energy management module or capsule according to claim 1 further comprising a microcontroller sub-system, which is supported by Over The Air programming (OTA), and firmware program changes are implementable, after installation, by remote wireless access.

6. A method of processing of sensor data collected using an energy management module or capsule according to claim 1, that in using identifies changes of patterns of sensor data and forecast future demand for electrical power.

7. The method according to claim 6, further comprising publishing results according to software applications connected to the Internet or other telecommunications networks.

* * * * *